United States Patent
Conti et al.

(10) Patent No.: US 12,500,179 B2
(45) Date of Patent: Dec. 16, 2025

(54) TECHNIQUES FOR FORMING A DEVICE WITH SCRIBE ASYMMETRY

(71) Applicant: Micron Technology, Inc., Boise, ID (US)

(72) Inventors: Anna Maria Conti, Milan (IT); Raj K. Bansal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 666 days.

(21) Appl. No.: 17/715,481

(22) Filed: Apr. 7, 2022

(65) Prior Publication Data

US 2023/0326867 A1    Oct. 12, 2023

(51) Int. Cl.
| | |
|---|---|
| *H01L 23/544* | (2006.01) |
| *H01L 21/78* | (2006.01) |
| *H01L 23/00* | (2006.01) |
| *H01L 25/00* | (2006.01) |
| *H01L 25/065* | (2023.01) |

(52) U.S. Cl.
CPC ............ *H01L 23/544* (2013.01); *H01L 21/78* (2013.01); *H01L 23/562* (2013.01); *H01L 25/0657* (2013.01); *H01L 25/50* (2013.01); *H01L 2223/5446* (2013.01); *H01L 2225/06506* (2013.01); *H01L 2225/06562* (2013.01)

(58) Field of Classification Search
None
See application file for complete search history.

(56) References Cited

U.S. PATENT DOCUMENTS

| | | | | |
|---|---|---|---|---|
| 2005/0282360 | A1* | 12/2005 | Kida | H01L 21/78 |
| | | | | 257/E23.179 |
| 2009/0032969 | A1* | 2/2009 | Pilla | H01L 25/0657 |
| | | | | 257/E23.024 |
| 2020/0395340 | A1* | 12/2020 | Lee | H01L 24/09 |
| 2021/0407929 | A1* | 12/2021 | Jeon | H01L 25/50 |
| 2022/0230992 | A1* | 7/2022 | Bin Azahar | H01L 24/49 |
| 2023/0028252 | A1* | 1/2023 | Jung | H01L 24/49 |
| 2023/0246000 | A1* | 8/2023 | Shen | H01L 24/48 |
| | | | | 257/676 |

* cited by examiner

*Primary Examiner* — Julio J Maldonado
*Assistant Examiner* — Pinaki Das
(74) *Attorney, Agent, or Firm* — Holland & Hart LLP

(57) ABSTRACT

Methods, systems, and devices for techniques for forming a device with scribe asymmetry are described. Circuits (e.g., arrays of memory cells) may be printed on a wafer and separated by scribes of various widths to increase an array efficiency of a fabrication process. For example, a scribe that extends in a first direction may have a width in a second direction. A first subset of scribes may have a first width, where one or more structures may be placed in the first subset of scribes to facilitate die testing and integration. A second subset of scribes may have a second width. In some examples, the structures may not be placed in the second subset of scribes and, accordingly, the second width may be less than the first width.

5 Claims, 6 Drawing Sheets

TECHNIQUES FOR FORMING A DEVICE WITH SCRIBE ASYMMETRY

FIELD OF TECHNOLOGY

The following relates to one or more systems, including techniques for forming a device with scribe asymmetry.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
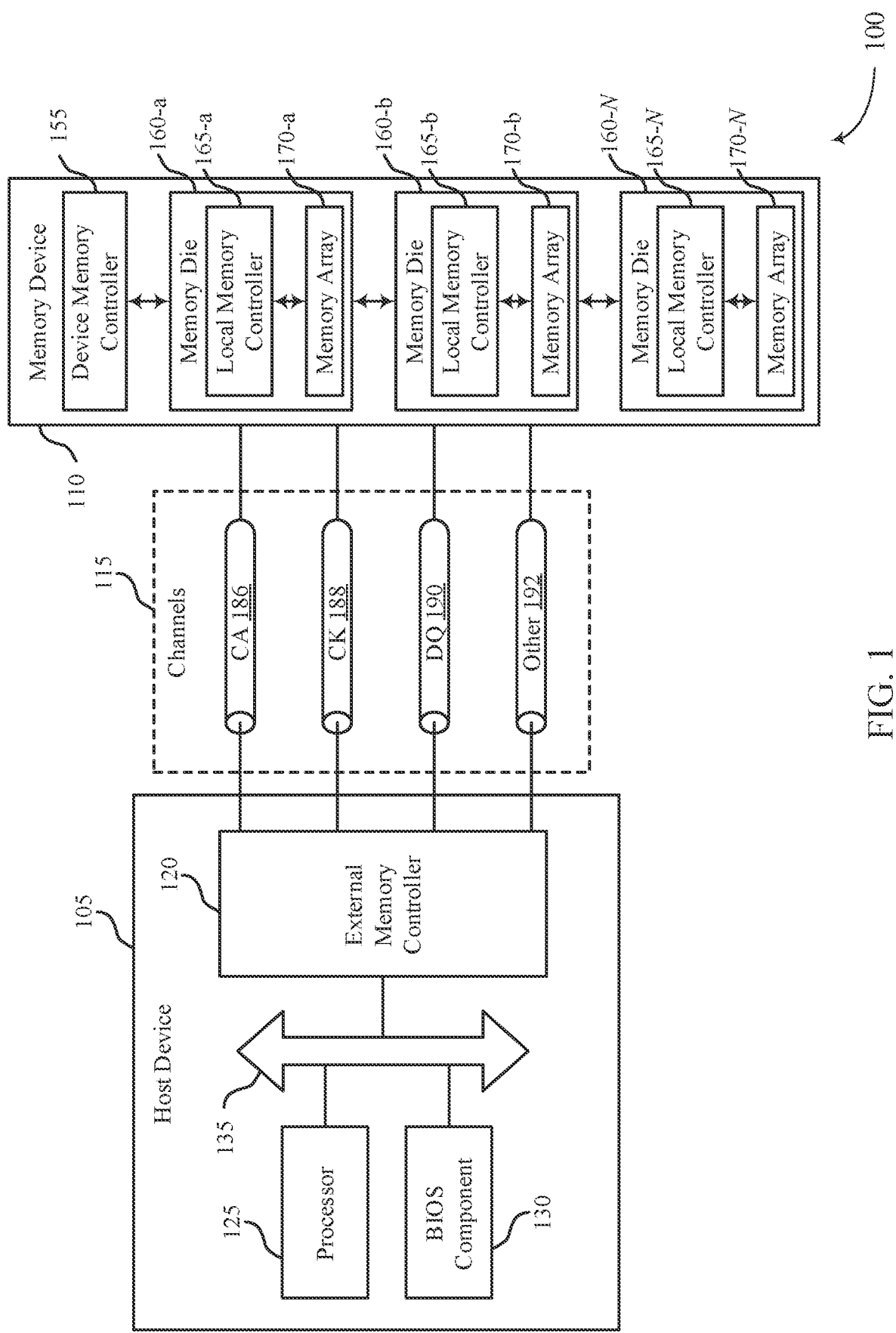
FIG. 1 illustrates an example of a system that supports techniques for forming a device with scribe asymmetry in accordance with examples as disclosed herein.

Dies (e.g., memory dies) may be fabricated from a wafer (e.g., a silicon wafer) using photolithography. In a photolithographic process, a reticle may be used to print a set of circuits on the wafer. In some examples, each circuit may include an array of memory cells. In some cases, the circuits may be printed in uniform rows and columns, in which, for example, each circuit of the set of circuits may be a distance from neighboring circuits in a first and a second direction (e.g., x- and y-directions). Additionally or alternatively, the wafer may include a set of scribes (e.g., a frame), where a scribe may refer to a space between two rows of circuits or between two columns of circuits. In some examples, structures may be placed in the scribes for testing and integration of dies during the fabrication process. In some cases, dies may be cut from the wafer, where cuts along each scribe may separate the dies. However, the set of scribes may include material (e.g., silicon) from the wafer that is lost during the fabrication process. That is, material included in the set of scribes may not be included in a circuit. It may be beneficial to reduce an amount of the wafer included in the set of scribes to decrease fabrication costs, improve resource efficiency, and improve fabrication rates. For example, if the size of the scribes is decreased, the quantity of circuits printed on the wafer may be increased.

According to the techniques described herein, circuits may be printed on a wafer and separated by scribes of various widths to increase an efficiency of a fabrication process. For example, a scribe which extends in a first direction (e.g., an "X" direction) may have a width in a second direction (e.g., a "Y" direction). A first subset of scribes (which in some examples may be referred to as "active scribes") may have a first width (e.g., 80 micrometers (μm), 60 μm, 50 μm, or another width), where one or more structures may be placed in the first subset of scribes to facilitate die testing and integration. A second subset of scribes (which in some examples may be referred to as "dicing scribes") may have a second width (e.g., 20 μm). In some examples, the structures may not be placed in the second subset of scribes and, accordingly, the second width may be less than the first width.

In some cases, the scribes extending in the first direction (e.g., the "X" direction) may alternate between scribes of the first subset and scribes of the second subset. Additionally or alternatively, scribes extending in the second direction (e.g., the "Y" direction) may alternate between scribes of a third subset and scribes of a fourth subset. Each scribe of the third subset of scribes may have a third width, which in some examples may be different than the first width or the second width. In some other examples, the third width may be similar to the first width. Each scribe of the fourth subset of scribes may have a fourth width, which in some examples may be similar to the second width. Combinations of active and dicing scribes may not be limited to examples provided herein.

Although features of the disclosure are described in the context of memory systems, it is to be understood that the techniques described herein may apply to other devices that may fabricated from a wafer using photolithography. For example, the techniques described herein may be used to fabricate an application-specific integrated circuit (ASIC), a component of an ASIC, or another programmable logic device, or any combination thereof, among other example devices.

Features of the disclosure are initially described in the context of systems and dies as described with reference to FIGS. 1 and 2. Features of the disclosure are described in the context of processing steps of a method for forming a device with scribe asymmetry and a stack of dies as described with reference to FIGS. 3A-3D and 4. These and other features of the disclosure are further illustrated by and described with reference to a flowchart that relate to techniques for forming a device with scribe asymmetry as described with reference to FIG. 5.

FIG. 1 illustrates an example of a system 100 that supports techniques for forming a device with scribe asymmetry in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an ASIC, a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

A memory die 160 may be an example of a two-dimensional (2D) array of memory cells or may be an example of a three-dimensional (3D) array of memory cells. In some examples, a 2D memory die 160 may include a single memory array 170. In some examples, a 3D memory die 160 may include two or more memory arrays 170, which may be stacked on top of one another or positioned next to one another (e.g., relative to a substrate). In some examples, memory arrays 170 in a 3D memory die 160 may be referred to as or otherwise include different sets (e.g., decks, levels, layers, dies). A 3D memory die 160 may include any quantity of stacked memory arrays 170 (e.g., two high, three high, four high, five high, six high, seven high, eight high). In some 3D memory dies 160, different decks may share a common access line such that some decks may share one or more of a word line, a digit line, or a plate line.

The device memory controller 155 may include components (e.g., circuitry, logic) operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the memory dies 160 may be fabricated from a wafer (e.g., a silicon wafer). Each memory die 160 may include a circuit, such as a memory array 170, printed on the wafer, for example using a photolithography process. In some examples, a bond pad row may be placed on the memory array 170. The wafer may be cut along each scribe of a set of scribes to separate the memory dies 160. The memory dies 160 may vary in size due to variations in scribe width. As described herein, the memory dies 160 may be separated such that a bond pad row of each memory die 160 may be a same distance from an edge of the memory die 160.

The memory dies 160 may be arranged in a stack in the memory device 110. The stack may be formed such that an edge of a first memory die 160 may be offset relative to an edge of a second memory die 160 located below the first memory die 160 in the stack, for example, to enable the memory dies 160 to be coupled to other components of the memory device 110. In some examples, each memory die 160 of the stack may be offset by a same distance. In some examples, each memory array 170 of the stack of memory dies 160 may be coupled with one or more memory controllers (e.g., a local memory controller 165, a device memory controller 155, or both) via one or more wire bonds. Each wire bond may include a contact placed in the bond pad row placed on the memory array 170.

Figure 2:
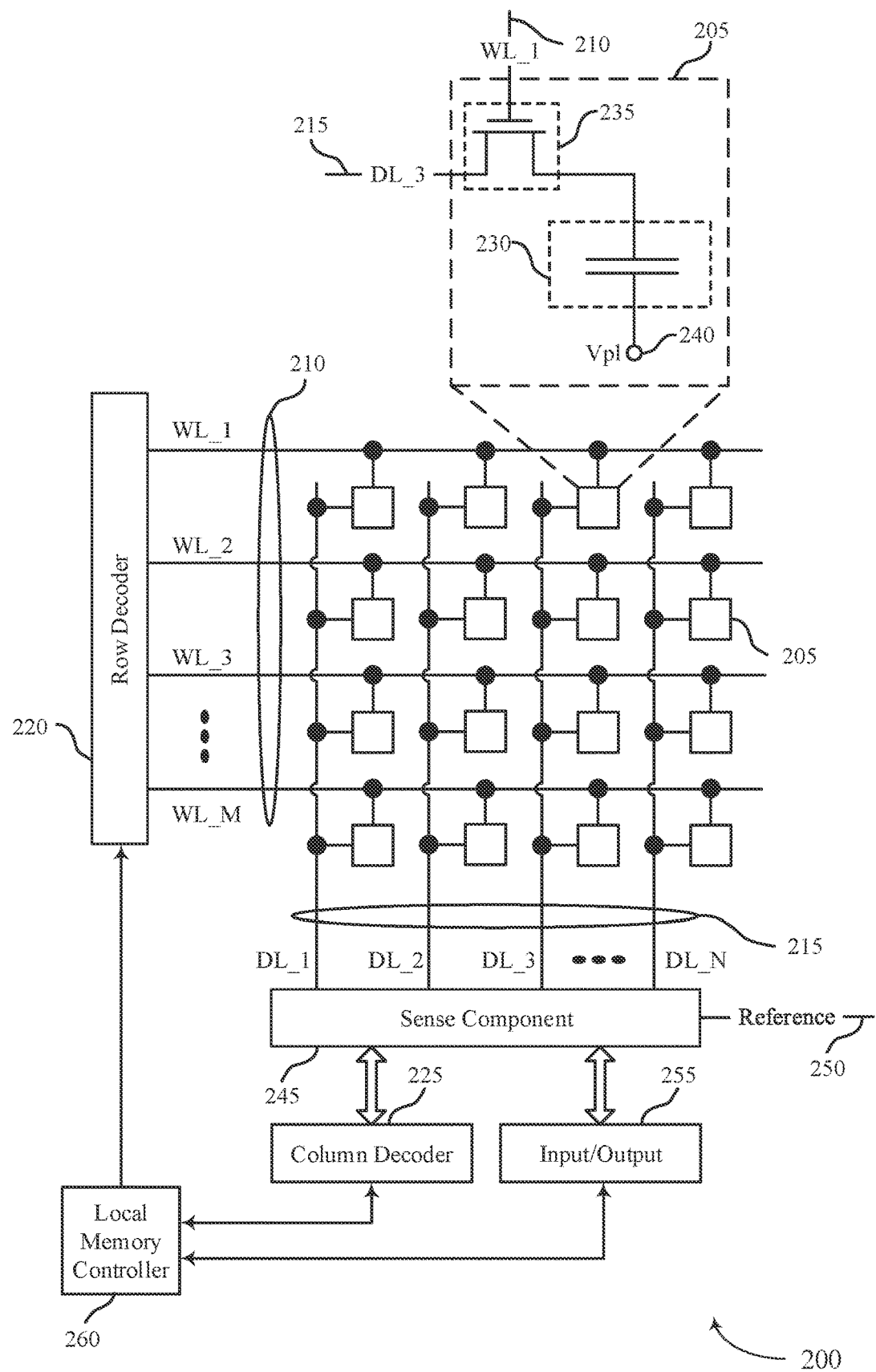
FIG. 2 illustrates an example of a memory die that supports techniques for forming a device with scribe asymmetry in accordance with examples as disclosed herein.

FIG. 2 illustrates an example of a memory die 200 that supports techniques for forming a device with scribe asymmetry in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210 and digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or a combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

In some examples, a set of dies (e.g., including the memory die 200) may be fabricated from a wafer (e.g., a silicon wafer). The memory die 200 may include a circuit, such as an array of memory cells 205, printed on the wafer using a photolithography process. In some examples, a bond pad row may be placed on the array. The wafer may be cut along each scribe of a set of scribes to separate the memory dies. The memory dies may vary in size due to variations in scribe width. As described herein, the memory dies may be separated such that a bond pad row of each memory die may be a same distance from an edge of the memory die.

The memory dies may be arranged in a stack in a memory device. The stack may be formed such that, an edge of the memory die 200 may be offset relative to an edge of a second memory die located below the memory die 200 in the stack, for example, to enable the memory dies to be coupled to other components of the memory device. In some examples, each memory die of the stack may be offset by a same distance. In some examples, each array of memory cells 205 may be coupled with one or more memory controllers (e.g., the local memory controller 260) via one or more wire bonds. Each wire bond may include a contact placed in the bond pad row on the array.

FIGS. 3A through 3D illustrate examples of processing steps 300 of a method for forming a device with scribe asymmetry in accordance with examples as disclosed herein. The processing steps illustrate top planar views of materials placed on a wafer 301. The wafer 301 may include a semiconductive material (e.g., silicon).

Figure 3A:
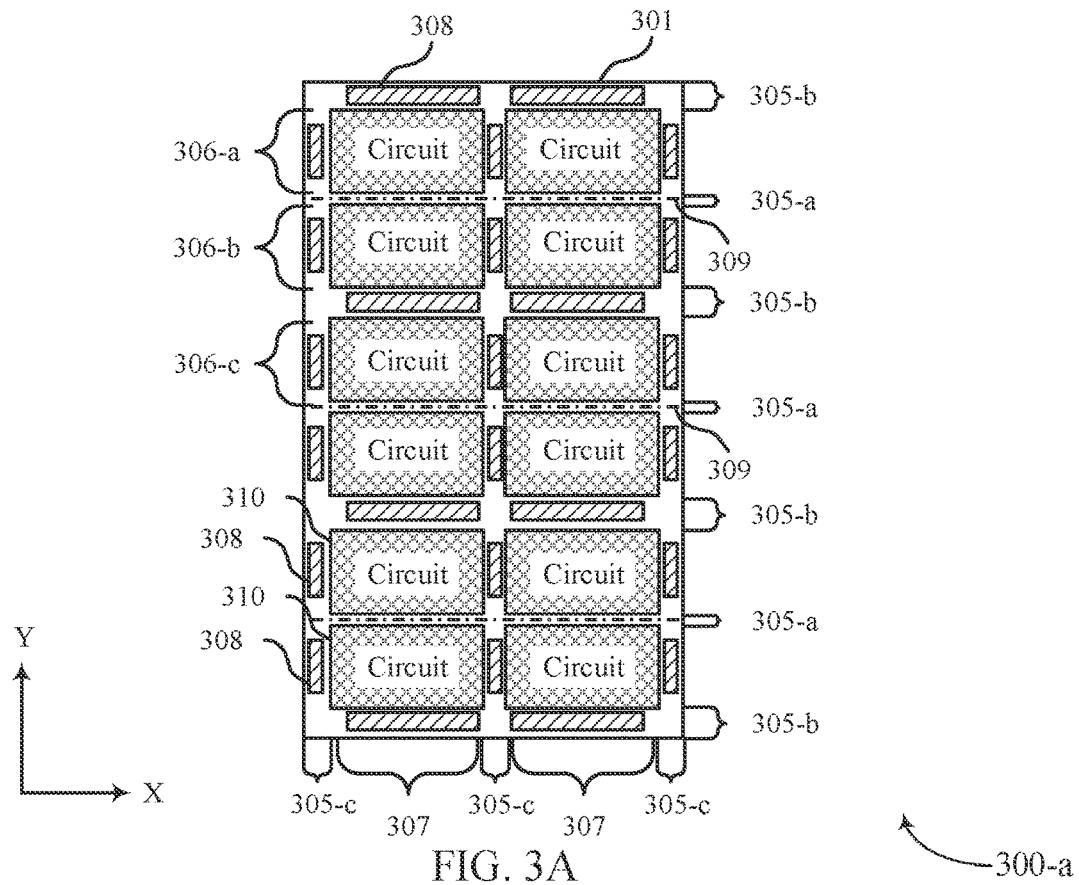
FIGS. 3A through 3D illustrate examples of processing steps of a method for forming a device with scribe asymmetry in accordance with examples as disclosed herein

In FIG. 3A, processing step 300-a is depicted and includes a top planar view of a first example die pattern. In the processing step 300-a, circuits 310 may be printed on the wafer 301 as part of a photolithography process. In some examples, the wafer 301 may be coated with a photosensitive film (e.g., photoresist). A photolithography tool may print circuits 310 of memory cells on the wafer 301 using a reticle, in which, for example, the reticle may focus a pattern of light (e.g., ultraviolet light) onto a field of the reticle including a portion of the wafer 301. The light may interact with (e.g., harden) the photosensitive film to form the circuits 310. Following the photolithography process, the field of the reticle may include the circuits 310 organized into rows 306 and columns 307 and a set of scribes 305, where the set of scribes 305 may refer to the portion of the wafer 301 not included in the circuits 310 in the field of the reticle. Each scribe 305 of the set of scribes 305 may separate either two rows 306 or two columns 307 of the circuits 310. That is, each scribe 305 may extend in a first direction (e.g., an "X" direction of the top planar view) or a second direction (e.g., a "Y" direction of the top planar view). The set of scribes 305 may correspond to the frame of the reticle, which may block a portion of the light during the photolithography process. In some examples, the photolithographic tool may repeat the process (e.g., step) to fill the wafer 301 with the circuits 310.

As part of the manufacturing process, the circuits 310 may be formed on a wafer 301. Then the wafer 301 may be cut to separate the circuits 310 from each other and to assemble the circuits 310 in configurations used for memory systems. The cutting of the wafer 301 may occur within the scribes 305 of the wafer 301. An active scribe may be an example of a region that is cut and may be used for other purposes as well. A dicing scribe may be an example of a region that is cut. In some cases, the dicing scribe may be used for other purposes as well.

In the processing step 300-a, a scribe 305-a, which may be an example of a dicing scribe, may extend in the first direction and have a first width in the second direction. A scribe 305-b, which may be an example of an active scribe, may extend in the first direction and have a second width in the second direction that is different (e.g., greater) than the first width. In the example illustrated in FIG. 3A, the scribes 305-a and 305-b may alternate in the second direction, where a scribe 305-a may separate a row 306-a from a row 306-b and a scribe 305-b may separate the row 306-b from a row 306-c. In some examples, each pair of columns 307 may be separated by a scribe 305-c (e.g., an active scribe), which may extend in the second direction and have a third width in the first direction. As illustrated in FIG. 3A, each scribe 305-c extending in the second direction may have the same third width in the first direction. In some examples, the third width may be the same as the second width (e.g., of the scribes 305-b).

In some examples, structures 308 may be placed in the scribes 305-b and 305-c (e.g., the active scribes) to facilitate testing and integration of dies. In some examples, the structures 308 may be placed by layering one or more thin films of material on the surface of the wafer 301 (e.g., via thermal oxidation, electrical deposition, spin-on film, photolithography, or another placement process). In some examples, the structures 308 may include parametric test structures, metrology test structures, alignment marks, registration marks, other structures or marks, or any combination thereof. In some examples, a first set of structures 308 may be placed in the scribes 305-b, and a second set of structures 308 may be placed in the scribes 305-c. The second width may be different from the third width, for example, based on the first and second sets of structures 308.

In some examples, one or more crack assist features 309 may be formed on the scribes 305-a. Examples of the crack assist features 309 may include, pillars layered on the surface of the scribes 305-a, slits etched into the set of scribes 305-a, other features, or any combination thereof. In some examples, the crack assist features 309 may improve cutting accuracy, in which, for example, the crack assist features 309 may reduce laser splash and laser leakage risk during cutting leading to fewer defects in the dies.

Figure 3B:
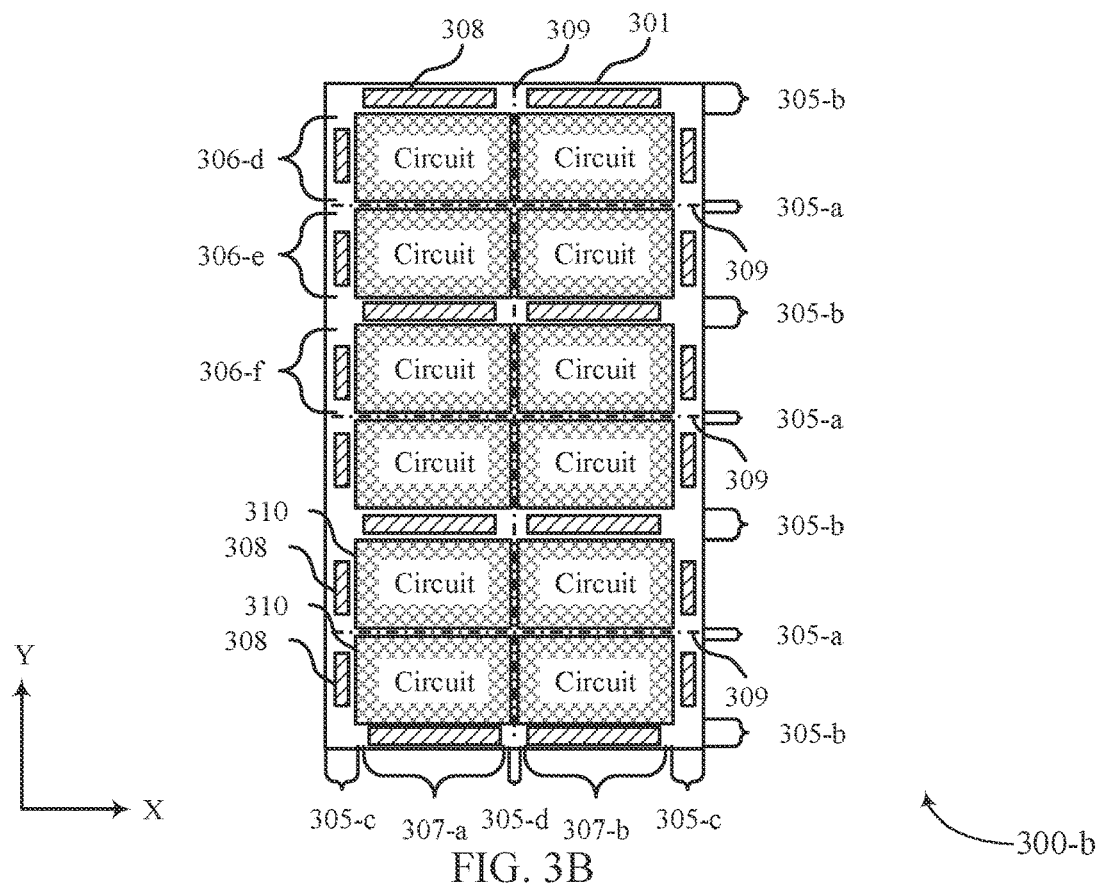

In FIG. 3B, processing step 300-b is depicted and includes a top planar view of a second example die pattern. That is, the processing step 300-b may be implemented as an alternative processing step to the processing step 300-a. In the processing step 300-b, circuits 310 may be printed on the wafer 301 as part of a photolithography process similar to the photolithography process described with reference to FIG. 3A. Following the photolithography process, the field of the reticle may include the circuits 310 organized into rows and columns and a set of scribes 305, where the set of scribes 305 may refer to the portion of the wafer 301 not included in the circuits 310 in the field of the reticle. Each scribe 305 of the set of scribes 305 may separate either two rows 306 or two columns 307 of the circuits 310.

In the processing step 300-b, a scribe 305-a, which may be an example of a dicing scribe, may extend in a first direction (e.g., an "X" direction of the top planar view) and have a first width in the second direction (e.g., a "Y" direction of the top planar view). A scribe 305-b, which may be an example of an active scribe, may extend in the first direction and have a second width in the second direction that is different (e.g., greater) than the first width. In the example illustrated in FIG. 3B, the scribes 305-a and 305-b may alternate in the second direction, where a scribe 305-a may separate a row 306-d from a row 306-e and a scribe 305-b may separate the row 306-e from a row 306-f.

In some examples, a scribe 305-c, which may be an example of an active scribe, may extend in the second direction and have a third width in the first direction. In some examples, the third width may be the same as the second width (e.g., of the scribes 305-b). A scribe 305-d, which may be an example of a dicing scribe, may extend in the second direction and have a fourth width in the first direction that is different (e.g., less) than the third width. In some examples, the fourth width may be the same as the first width (e.g., of the scribes 305-a). As illustrated in FIG. 3B, the scribes 305-c and 305-d may alternate in the first direction, where a scribe 305-d may separate a column 307-a from a column 307-b, and a scribe 305-c may separate the column 307-b from an edge of the second example die pattern. In some examples, structures 308 may be placed in the scribes 305-b and 305-c (e.g., the active scribes). In some examples, one or more crack assist features 309 may be formed on the scribes 305-a and scribes 305-d (e.g., the dicing scribes).

The processing steps 300-a and 300-b may illustrate two possible configurations of the field of the reticle. Die pattern configurations may not be limited to the examples illustrated in FIGS. 3A and 3B. For example, scribe widths may vary according to a pattern different from the alternating patterns illustrated in FIGS. 3A and 3B.

Figure 3C:
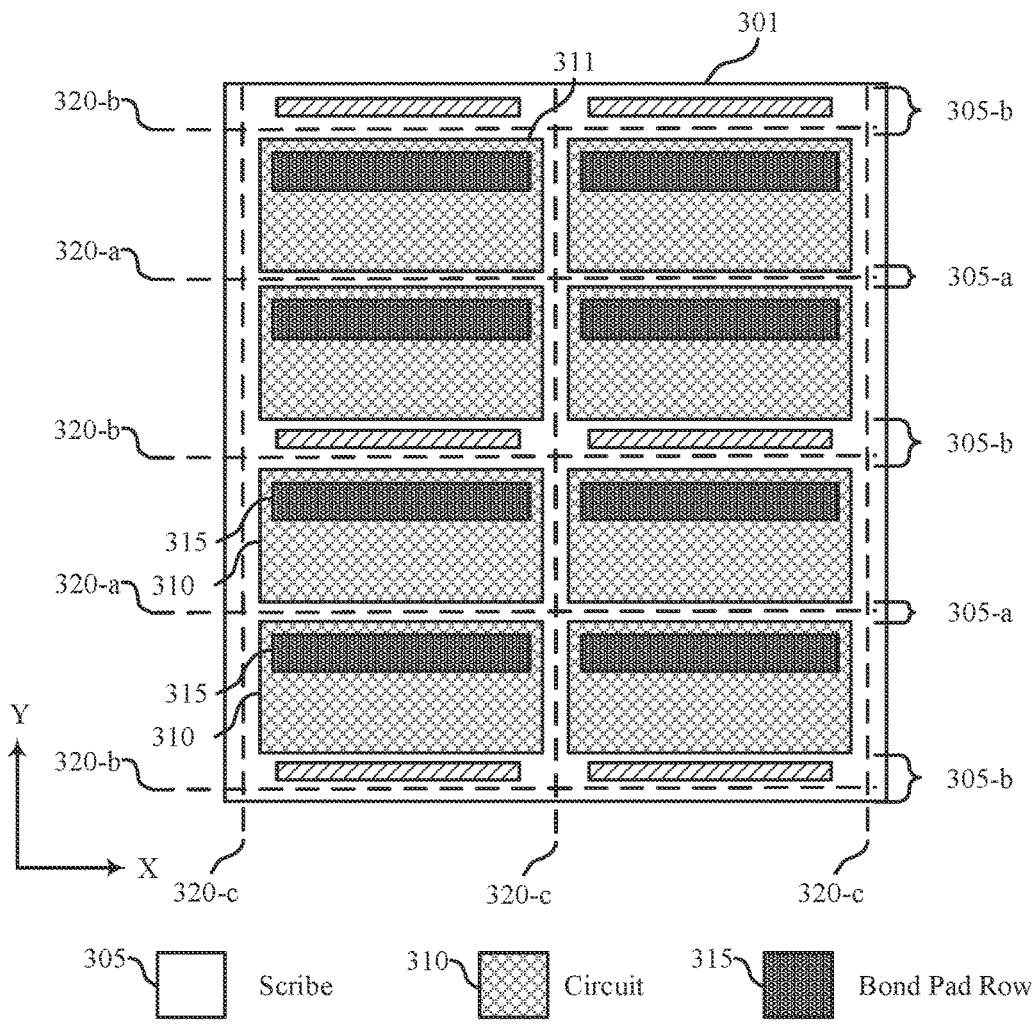

In FIG. 3C, processing step 300-c is depicted and includes a top planar view of the first example die pattern. In the processing step 300-c, a bond pad row 315 may be placed on each circuit 310. In some examples, the bond pad rows 315 may be placed by layering one or more thin films of material on the surface of the circuits 310 (e.g., via thermal oxidation, electrical deposition, spin-on film, photolithography, or another placement process). Each bond pad row 315 may include one or more contact surfaces, where wire bonds may be connected (e.g., using wedge bonding, ball bonding, thermosonic bonding, stitch bonding, or soldering) to the contact surfaces of the bond pad row 315 to couple the circuit 310 to a controller, to other components of a device, or both. In some cases, the bond pad rows 315 may extend in the first direction. In some examples, each bond pad row 315 may be a same distance from an edge 311 of an circuit 310, where the edge 311 may extend in the first direction.

In some examples, cuts 320 may be made along the scribes 305 to separate the circuits 310. In some examples, the cuts 320 may be made using a laser. The cuts 320 may remove a width of material that is less than the first width or the second width. In some cases, cuts 320-$a$ along the scribes 305-$a$ (e.g., the dicing scribes) may be made through a center of each scribe 305-$a$, and cuts 320-$b$ along the scribes 305-$b$ (e.g., the active scribes) may be offset from a center of each scribe 305-$b$. In some examples, a distance of the offset may be based on a difference between the first width and the second width. In some examples, cuts 320-$c$ may be made along the scribes 305-$c$ extending in the second direction.

Figure 3D:
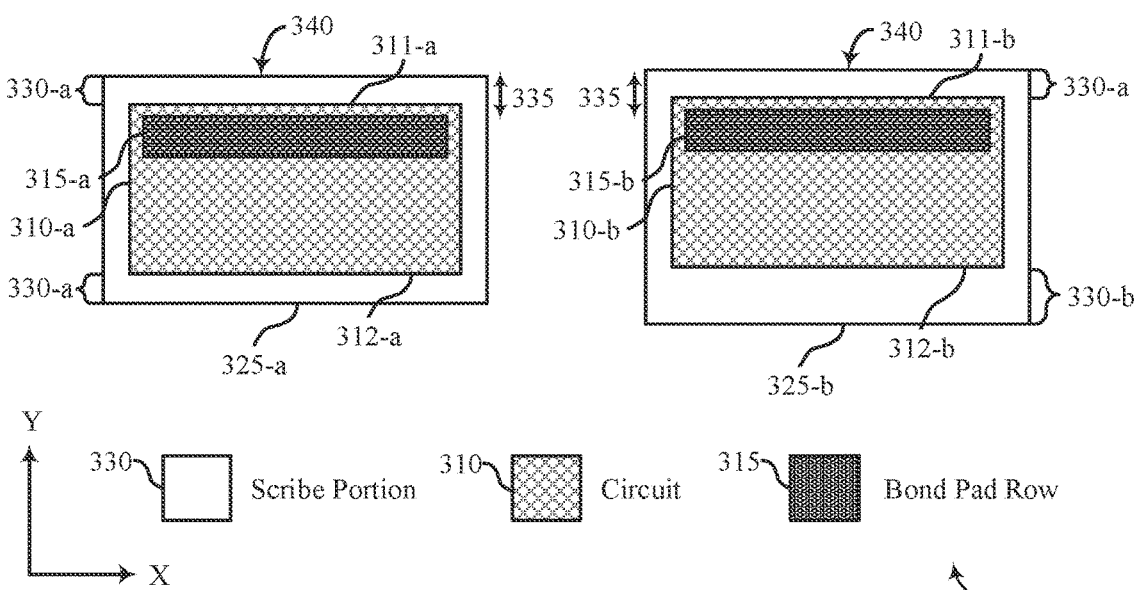

In FIG. 3D, processing step 300-$d$ is depicted and includes a top planar view of dies 325-$a$ and 325-$b$, where the dies 325-$a$ and 325-$b$ may be separated from the wafer 301 along the cuts 320. The position of the cuts 320 within the scribes 305 may vary for different scribes 305. In such examples, the die 325 that results from the cuts 320 may have different widths of scribe portions 330 on its various sides based on the width of the scribe 305 and the position of the cut 320 within the scribe 305. Each die 325 may include a corresponding circuit 310 and a bond pad row 315. In some cases, each die 325 may include one or more scribe portions 330 along edges of the die 325, based on the width of the removed material being less than the first width or the second width of the scribes 305. For example, the die 325-$a$ may include a scribe portion 330-$a$ along an edge 311-$a$ and a scribe portion 330-$a$ along an edge 312-$a$ of the circuit 310-$a$. In some examples, each scribe portion 330-$a$ may extend in the first direction and have a same width. The die 325-$b$ may include a scribe portion 330-$a$ along an edge 311-$b$ and a scribe portion 330-$b$ along an edge 312-$b$ of the circuit 310-$b$. The scribe portion 330-$b$ may extend in the first direction and have a width different from the width of the scribe portion 330-$a$. In some examples, based on the width of the scribe portion 330-$a$, a bond pad row 315 of each die 325 may be a same distance 335 from an edge 340 of the die 325.

Figure 4:
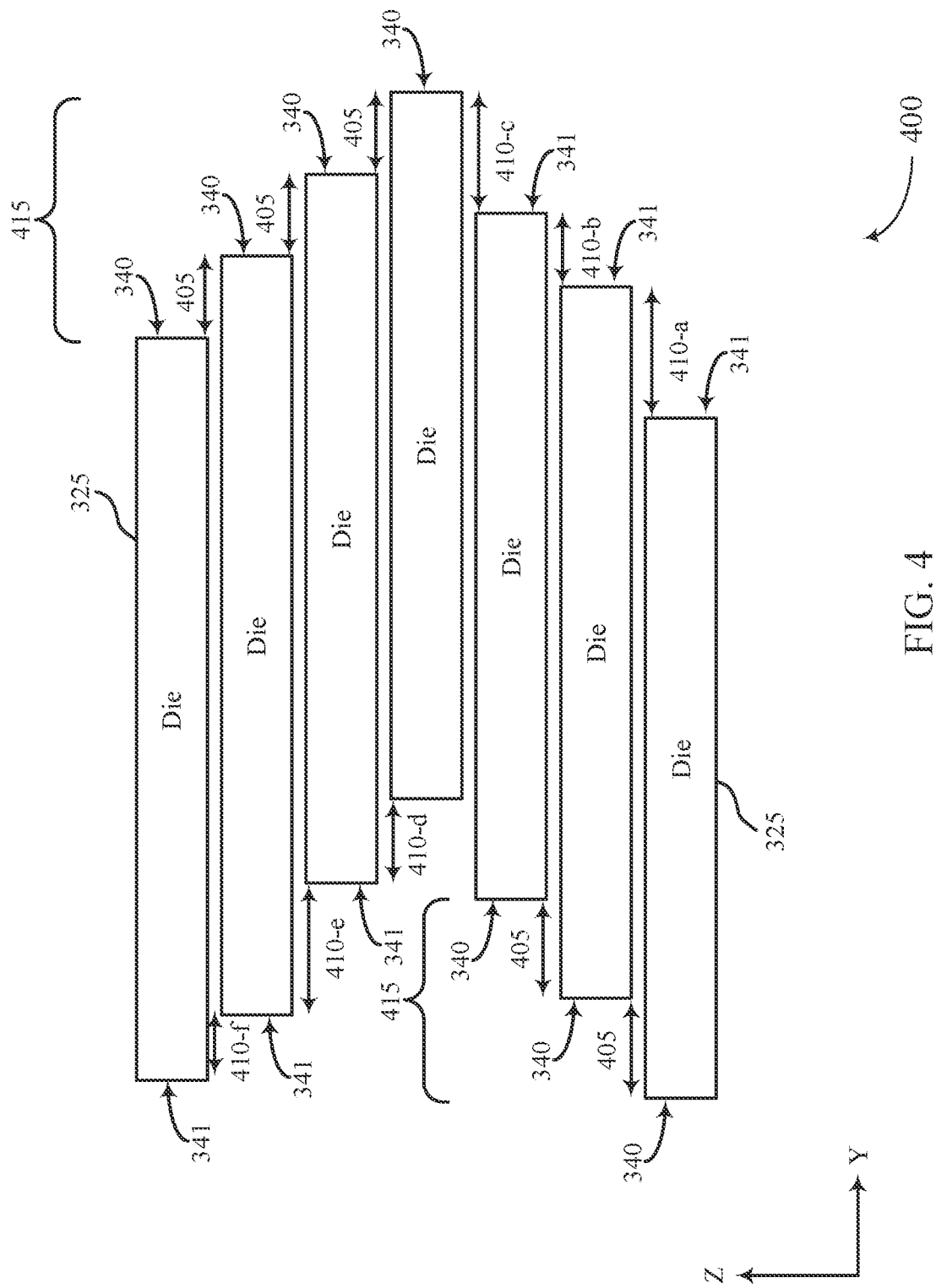
FIG. 4 illustrates an example of a stack of dies that supports techniques for forming a device with scribe asymmetry in accordance with examples as disclosed herein.

FIG. 4 illustrates an example of a stack 400 of dies 325 that supports techniques for forming a device with scribe asymmetry in accordance with examples as disclosed herein. In some examples, the stack 400 may be formed to facilitate packaging and operation of the dies 325 in a device.

Each die may extend in a first direction, which may, in some examples, correspond to a "Y" direction of the top planar views illustrated in FIGS. 3A through 3D. In some examples, each die 325 may include a circuit printed on a wafer, for example using a photolithography process as described herein. In some examples, a bond pad row may be placed on each circuit. The wafer may be cut along each scribe of a set of scribes to separate the dies 325. The dies 325 may vary in size due to variations in scribe width. As described herein, the dies 325 may be separated such that a bond pad row of each die 325 may be a same distance from an edge 340 of the die 325.

The dies 325 may be arranged in the stack 400 in the device. The stack 400 may extend in a second direction (e.g., a "Z" direction). The stack 400 may be formed such that the edge 340 of a first die 325 may be offset relative to the edge 340 of a second die 325 located below the first die 325 in the stack 400, for example, to enable the dies 325 to be coupled to other components of the device. In some examples, each circuit of the dies 325 may be coupled with one or more controllers (e.g., a local memory controller, a device memory controller, or both) via one or more wire bonds. Each wire bond may include a contact placed in the bond pad row placed on the circuit. In some examples, each die 325 of the stack 400 may be offset by a same distance 405 on a side 415, for example, to facilitate efficient wire bonding. Based on the varying sizes of the dies 325, an opposite edge 341 of a first die 325 may be offset by one of distances 410-$a$ through 410-$f$ relative to an opposite edge 341 of a second die 325 located below the first die 325 in the stack 400. In some examples, each of the distances 410-$a$ through 410-$f$ may be different. In some other examples, one or more of the distances 410-$a$ through 410-$f$ may be equivalent.

Figure 5:
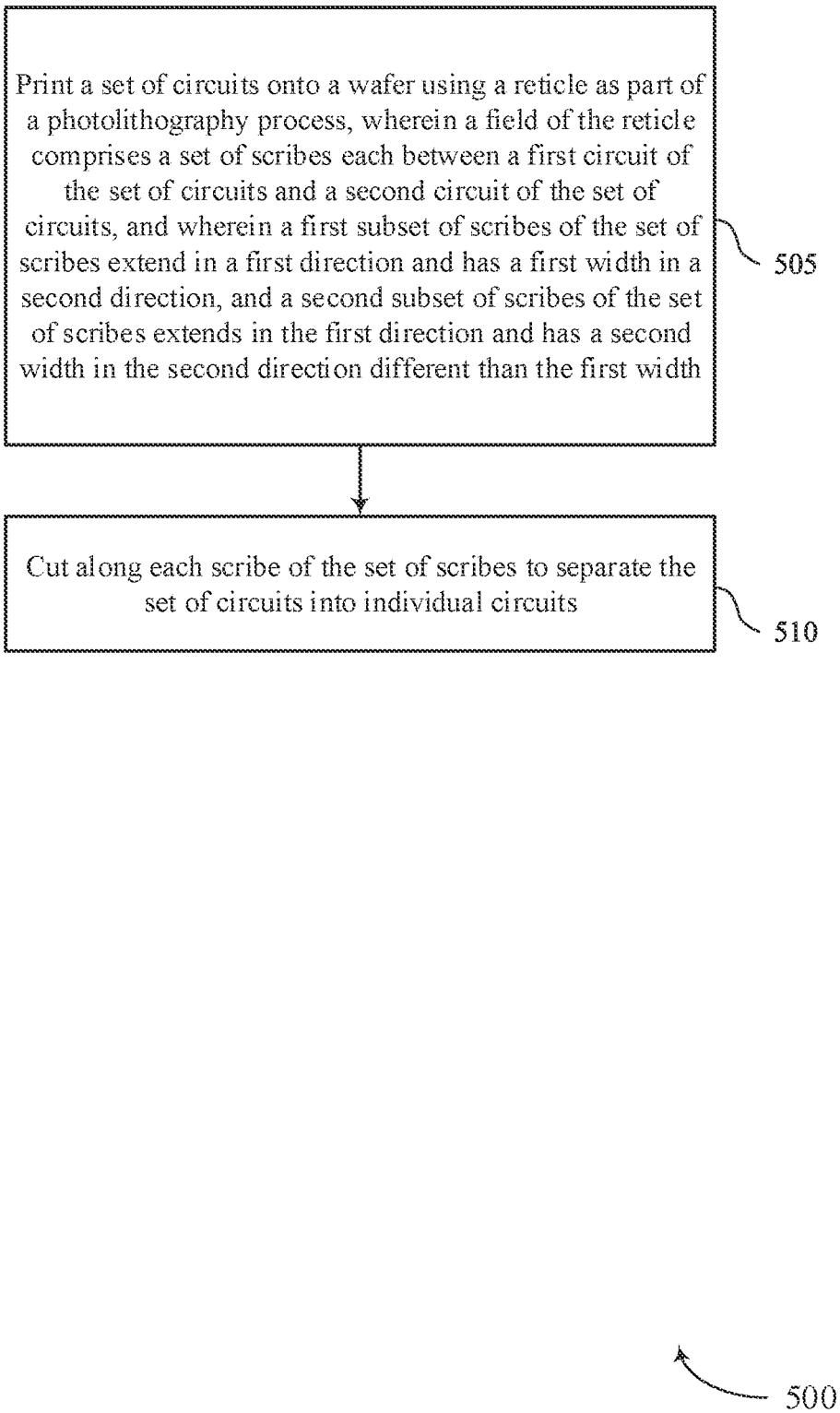
FIG. 5 shows a flowchart illustrating a method or methods that support techniques for forming a device with scribe asymmetry in accordance with examples as disclosed herein.

FIG. 5 shows a flowchart illustrating a method 500 that supports techniques for forming a device with scribe asymmetry in accordance with examples as disclosed herein. The operations of method 500 may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 505, the method may include printing a set of circuits onto a wafer using a reticle as part of a photolithography process, where a field of the reticle includes a set of scribes each between a first circuit of the set of circuits and a second circuit of the set of circuits, and where a first subset of scribes of the set of scribes extends in a first direction and has a first width in a second direction, and a second subset of scribes of the set of scribes extends in the first direction and has a second width in the second direction different than the first width. The operations of 505 may be performed in accordance with examples as disclosed herein.

At 510, the method may include cutting along each scribe of the set of scribes to separate the set of circuits into individual circuits. The operations of 510 may be performed in accordance with examples as disclosed herein.

In some examples, an apparatus (e.g., a manufacturing system) as described herein may perform a method or methods, such as the method 500. The apparatus may include features, circuitry, logic, means, or instructions (e.g., a set of instructions executable by one or more controllers to control one or more functional elements of the manufacturing system), or any combination thereof for performing the following aspects of the present disclosure:

Aspect 1: A method or apparatus comprising operations, features, circuitry, logic, means, or instructions, or any combination thereof for printing a set of circuits onto a wafer using a reticle as part of a photolithography process, wherein: a field of the reticle comprises a set of scribes each between a first circuit of the set of circuits and a second circuit of the set of circuits; and a first subset of scribes of the set of scribes extends in a first direction and has a first width in a second direction, and a second subset of scribes of the set of scribes extends in the first direction and has a second width in the second direction different than the first width; and cutting along each scribe of the set of scribes to separate the set of circuits into individual circuits.

Aspect 2: The method or apparatus of aspect 1, further comprising operations, features, circuitry, logic, means, or instructions, or any combination thereof for placing, on each scribe of the first subset of scribes, one or more structures associated with the set of circuits, wherein the one or more structures are placed before cutting along each scribe of the set of scribes.

Aspect 3: The method or apparatus of any of aspects 1 through 2, further comprising operations, features, circuitry, logic, means, or instructions, or any combination thereof for forming, on each scribe of the second subset of scribes, one or more crack assist structures based at least in part on the second width.

Aspect 4: The method or apparatus of any of aspects 1 through 3 wherein a third subset of scribes of the set of scribes extends in the second direction and has the first width in the first direction and a fourth subset of scribes of the set of scribes extends in the second direction and has the second width in the first direction.

Aspect 5: The method or apparatus of aspect 4, wherein: the third width comprises the first width; and the fourth width comprises the second width.

Aspect 6: The method or apparatus of aspect 4, further comprising operations, features, circuitry, logic, means, or instructions, or any combination thereof for placing, on each scribe of the third subset of scribes, one or more structures associated with the set of circuits, wherein the one or more structures are placed before cutting along each scribe of the set of scribes.

Aspect 7: The method or apparatus of any of aspects 1 through 6, wherein a cut along each scribe of the set of scribes removes a third width of material that is less than the first width and less than the second width and the cut along each scribe of the first subset of scribes is offset from a center of the scribe by an offset distance based at least in part on the second width.

Aspect 8: The method or apparatus of aspect 7, further comprising operations, features, circuitry, logic, means, or instructions, or any combination thereof for placing a bond pad row on each circuit of the set of circuits, wherein the bond pad row of each circuit of the set of circuits extends in the first direction and is located a first distance from the cut along the scribe based at least in part on the offset distance.

Aspect 9: The method or apparatus of any of aspects 1 through 8, further comprising operations, features, circuitry, logic, means, or instructions, or any combination thereof for forming a stack based at least in part on separating the set of circuits, wherein; the stack comprises a set of dies; each die of the set of dies comprises a circuit of the set of circuits; a bond pad row of each die of the set of dies is located a first distance from an edge of the die in the second direction based at least in part on the cutting; a first subset of dies of the set of dies has a third width in the second direction, the third width based at least in part on the first width, the second width, and the cutting; a second subset of dies of the set of dies has a fourth width in the second direction, the fourth width based at least in part on the second width and the cutting; the third width is different than the fourth width; and a first edge of a first die of the set of dies is offset by a second distance in the second direction relative to a second edge of a second die of the set of dies, the second die located below the first die in the stack.

Aspect 10: The method or apparatus of aspect 9, wherein the stack extends in a third direction at an angle relative to the first direction.

Aspect 11: The method or apparatus of any of aspects 9 through 10, further comprising operations, features, circuitry, logic, means, or instructions, or any combination thereof for coupling each die of the stack with a controller via one or more wire bonds, a contact of each wire bond located in the bond pad row of the die.

Aspect 12: The method or apparatus of any of aspects 1 through 11, wherein the second width is less than the first width.

Aspect 13: The method or apparatus of any of aspects 1 through 12, wherein each circuit of the set of circuits is between a first scribe of the first subset of scribes and a second scribe of the second subset of scribes.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 14: An apparatus, comprising: a set of memory dies, wherein: each memory die comprises a bond pad row extending in a first direction and located a first distance from an edge of the memory die in a second direction; a first subset of memory dies of the set of memory dies has a first width in the second direction; a second subset of memory dies of the set of memory dies has a second width in the second direction, the second width different than the first width; and a memory controller coupled with each memory die of the set of memory dies via one or more wire bonds, a contact of each wire bond located in the bond pad row of the memory die.

Aspect 15: The apparatus of aspect 14, wherein: the set of memory dies is arranged in a stack that extends in a third direction at an angle relative to the first direction; and a first edge of a first memory die of the set of memory dies is offset by a second distance in the second direction relative to a second edge of a second memory die of the set of memory dies, the second memory die located below the first memory die in the stack.

Aspect 16: The apparatus of any of aspects 14 through 15, wherein: each memory die of the first subset of memory dies comprises a first portion of a first scribe and a second portion of a second scribe; the first portion extends in the first direction and has a third width in the second direction; and the second portion extends in the first direction and has a fourth width in the second direction, the fourth width different, than the third width.

Aspect 17: The apparatus of any of aspects 14 through 16, wherein: each memory die of the second subset of memory dies comprises a first portion of a first scribe and a second portion of a second scribe; the first portion extends in the first direction and has a third width in the second direction; and the second portion extends in the first direction and has the third width in the second direction.

Aspect 18: The apparatus of any of aspects 14 through 17, wherein the second width is less than the first width.

An apparatus is described. The following provides an overview of aspects of the apparatus as described herein:

Aspect 19: An apparatus, comprising: a set of circuits printed onto a wafer using a reticle as part of a photolithography process; and a set of scribes on the wafer, wherein: each scribe of the set of scribes is between a first circuit of the set of circuits and a second circuit of the set of circuits; a first subset of scribes of the set of scribes extends in a first direction and has a first width in a second direction and a second subset of scribes of the set of scribes extends in the first direction and has a second width in the second direction that is different than the first width.

Aspect 20: The apparatus of aspect 19, further comprising: one or more structures placed on each scribe of the first subset of scribes, the one or more structures associated with the set of circuits.

Aspect 21: The apparatus of any of aspects 19 through 20, further comprising: one or more crack assist structures on each scribe of the second subset of scribes, the one or more crack assist structures formed based at least in part on the second width.

Aspect 22: The apparatus of any of aspects 19 through 21, further comprising: a bond pad row placed on each circuit of the set of circuits.

Aspect 23: The apparatus of any of aspects 19 through 22, wherein: a third subset of scribes of the set of scribes extends in the second direction and has the first width in the first direction; and a fourth subset of scribes of the set of scribes extends in the second direction and has the second width in the first direction.

Aspect 24: The apparatus of aspect 23, further comprising: one or more structures placed on each scribe of the third subset of scribes, the one or more structures associated with the set of circuits.

Aspect 25: The apparatus of any of aspects 19 through 24, the second width is less than the first width.

Aspect 26: The apparatus of any of aspects 19 through 25, wherein each circuit of the set of circuits is between a first scribe of the first subset of scribes and a second scribe of the second subset of scribes.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The terms "layer" and "level" used herein refer to an organization (e.g., a stratum, a sheet) of a geometrical structure (e.g., relative to a substrate). Each layer or level may have three dimensions e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
 a set of memory dies arranged in a consecutive stack, wherein:
  each memory die comprises a bond pad row extending in a first direction and located a first distance from a first edge of the memory die in a second direction;
  each memory die comprises a second edge opposite the first edge;
  a first subset of memory dies of the set of memory dies has a first width in the second direction from the first edge to the second edge;
  a second subset of memory dies of the set of memory dies has a second width in the second direction from the first edge to the second edge, the second width different than the first width;
  the first edge of a first memory die of the consecutive stack is offset in the second direction by a second distance relative to the first edge of a second memory die located directly below and adjacent to the first memory die in the consecutive stack, the first memory die and the second memory die being of the first subset of memory dies;
  the second edge of the first memory die is offset in the second direction by a third distance relative to the second edge of the second memory die;
  the first edge of the second memory die is offset in the second direction by a fourth distance relative to the second edge of a third memory die located directly below and adjacent to the second memory die in the consecutive stack, the third memory die being of the second subset of memory dies, the fourth distance different than the third distance based at least in part on the second width being different than the first width; and
  the second edge of the second memory die is offset in the second direction by the second distance relative to the first edge of the third memory die; and
 a memory controller coupled with each memory die of the set of memory dies via the bond pad row of each memory die, wherein the bond pad row of the first memory die and the bond pad row of the second memory die are exposed on a first side of the consecutive stack, and wherein the bond pad row of the third memory die is exposed on a second side of the consecutive stack opposite the first side.

2. The apparatus of claim 1, wherein:
 at least a portion of the consecutive stack extends in a third direction at an angle relative to the first direction.

3. The apparatus of claim 1, wherein:
 each memory die of the first subset of memory dies comprises a first portion of a first scribe and a second portion of a second scribe;
 the first portion extends in the first direction and has a third width in the second direction; and
 the second portion extends in the first direction and has a fourth width in the second direction, the fourth width different than the third width.

4. The apparatus of claim 1, wherein:
 each memory die of the second subset of memory dies comprises a first portion of a first scribe and a second portion of a second scribe;

the first portion extends in the first direction and has a third width in the second direction; and the second portion extends in the first direction and has the third width in the second direction.

5. The apparatus of claim 1, wherein the second width is less than the first width.

\* \* \* \* \*